(12) United States Patent
Zhang et al.

(10) Patent No.: US 9,600,112 B2
(45) Date of Patent: Mar. 21, 2017

(54) SIGNAL TRACE PATTERNS FOR FLEXIBLE SUBSTRATES

(71) Applicant: Apple Inc., Cupertino, CA (US)

(72) Inventors: Zhen Zhang, San Jose, CA (US); Paul S. Drzaic, Morgan Hill, CA (US); Yi Tao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/511,945

(22) Filed: Oct. 10, 2014

(65) Prior Publication Data

US 2016/0103534 A1    Apr. 14, 2016

(51) Int. Cl.
| | |
|---|---|
| *H05K 1/02* | (2006.01) |
| *H05K 1/03* | (2006.01) |
| *G06F 1/16* | (2006.01) |
| *G06F 3/041* | (2006.01) |

(52) U.S. Cl.
CPC ............ *G06F 3/0412* (2013.01); *G06F 1/169* (2013.01); *H05K 1/028* (2013.01); *H05K 1/0296* (2013.01); *H05K 1/0393* (2013.01); *G06F 2203/04102* (2013.01); *H05K 2201/0979* (2013.01); *H05K 2201/09263* (2013.01); *H05K 2201/09663* (2013.01); *H05K 2201/09672* (2013.01); *H05K 2201/10106* (2013.01)

(58) Field of Classification Search
CPC ..... H01L 23/498; H01L 25/10; H01L 25/105; G06F 3/041; G06F 1/16; G06F 2203/04102; H05K 1/0296; H05K 1/0303
USPC ............... 257/678, 686, 778, 734, 773, 774; 345/173
See application file for complete search history.

(56) References Cited

U.S. PATENT DOCUMENTS

| | | |
|---|---|---|
| 4,066,855 A | 1/1978 | Zenk |
| 4,085,302 A | 4/1978 | Zenk et al. |
| 4,958,205 A | 9/1990 | Takeda et al. |
| (Continued) | | |

FOREIGN PATENT DOCUMENTS

| | | |
|---|---|---|
| EP | 1801647 | 6/2007 |
| EP | 2187443 | 5/2010 |
| (Continued) | | |

OTHER PUBLICATIONS

Byung Duk Yang et al., U.S Appl. No. 13/837,311, filed Mar. 15, 2013.

(Continued)

*Primary Examiner* — Alexander Oscar Williams
(74) *Attorney, Agent, or Firm* — Treyz Law Group, P.C.; G. Victor Treyz; Zachary D. Hadd

(57) ABSTRACT

A flexible substrate may have one or more bends. A bend in a flexible substrate may be made along a bend axis. Conductive traces in the flexible substrate may have elongated shapes. Each conductive trace may extend along a longitudinal axis that is perpendicular to the bend axis. Metal or other conductive materials may form the conductive traces. The traces may be formed from a chain of linked segments. Each segment may have patterned trace portions that surround one, two, or more than two openings. Traces may also be formed that have multiple layers of metal or other conductive material interconnected using vias. A polymer layer may cover the traces to align a neutral stress plane with the traces and to serve as a moisture barrier layer.

16 Claims, 13 Drawing Sheets

(56) References Cited

U.S. PATENT DOCUMENTS

| | | | |
|---|---|---|---|
| 5,075,237 A | 12/1991 | Wu | |
| 5,483,261 A | 1/1996 | Yasutake | |
| 5,488,204 A | 1/1996 | Mead et al. | |
| 5,592,199 A * | 1/1997 | Kawaguchi | G02F 1/13452 257/E23.065 |
| 5,717,556 A | 2/1998 | Yanagida | |
| 5,825,352 A | 10/1998 | Bisset et al. | |
| 5,835,079 A | 11/1998 | Shieh | |
| 5,880,411 A | 3/1999 | Gillespie et al. | |
| 5,990,492 A | 11/1999 | Kim et al. | |
| 6,037,017 A | 3/2000 | Kashiro | |
| 6,104,464 A | 8/2000 | Adachi et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,372,636 B1 | 4/2002 | Chooi et al. | |
| 6,500,701 B2 | 12/2002 | Higashi et al. | |
| 6,690,387 B2 | 2/2004 | Zimmerman et al. | |
| 5,235,451 A1 | 10/2004 | Auch et al. | |
| 6,803,245 B2 | 10/2004 | Auch et al. | |
| 6,869,825 B2 | 3/2005 | Chiu | |
| 6,882,398 B2 | 4/2005 | Watanabe et al. | |
| 6,956,633 B2 | 10/2005 | Okada et al. | |
| 6,970,219 B1 | 11/2005 | Hermann | |
| 7,015,894 B2 | 3/2006 | Morohoshi | |
| 7,034,913 B2 | 4/2006 | Ishida | |
| 7,184,064 B2 | 2/2007 | Zimmerman et al. | |
| 7,221,012 B2 | 5/2007 | Chu et al. | |
| 7,258,549 B2 * | 8/2007 | Asahi | H01R 13/2414 174/255 |
| 7,453,542 B2 | 11/2008 | Muramatsu et al. | |
| 7,465,678 B2 | 12/2008 | Bhattacharya | |
| 7,476,896 B2 | 1/2009 | Choi et al. | |
| 7,495,736 B2 | 2/2009 | Chen et al. | |
| 7,541,671 B2 | 6/2009 | Foust et al. | |
| 7,593,086 B2 | 9/2009 | Jeong et al. | |
| 7,593,087 B2 | 9/2009 | Jang | |
| 7,663,607 B2 | 2/2010 | Hotelling et al. | |
| 7,767,502 B2 | 8/2010 | Kim et al. | |
| 7,787,917 B2 | 8/2010 | Aoki et al. | |
| 7,834,451 B2 | 11/2010 | Lee et al. | |
| 7,843,041 B2 | 11/2010 | Kodaira et al. | |
| 7,936,405 B2 | 5/2011 | Kitagawa | |
| 8,003,986 B2 | 8/2011 | Teng et al. | |
| 8,039,838 B2 | 10/2011 | Heitzinger et al. | |
| 8,106,309 B2 | 1/2012 | Hwang | |
| 8,113,902 B2 | 2/2012 | Kang et al. | |
| 8,134,675 B2 | 3/2012 | Kawaguchi et al. | |
| 8,194,048 B2 | 6/2012 | Oowaki | |
| 8,203,261 B2 | 6/2012 | Tanaka et al. | |
| 8,319,725 B2 | 11/2012 | Okamoto et al. | |
| 8,373,181 B2 | 2/2013 | Aurongzeb et al. | |
| 8,434,909 B2 | 5/2013 | Nichol et al. | |
| 8,471,995 B2 | 6/2013 | Tseng et al. | |
| 8,716,932 B2 | 5/2014 | Rappoport et al. | |
| 8,723,824 B2 | 5/2014 | Myers et al. | |
| 8,724,304 B2 | 5/2014 | Raff et al. | |
| 9,716,932 | 5/2014 | Rappoport et al. | |
| 8,787,016 B2 | 7/2014 | Rothkopf et al. | |
| 8,804,347 B2 | 8/2014 | Martisauskas et al. | |
| 8,816,977 B2 | 8/2014 | Rothkopf et al. | |
| 8,929,085 B2 | 1/2015 | Franklin et al. | |
| 8,934,228 B2 | 1/2015 | Franklin et al. | |
| 8,947,627 B2 | 2/2015 | Rappoport et al. | |
| 9,098,242 B2 | 8/2015 | Rappoport et al. | |
| 9,110,320 B2 | 8/2015 | Chen et al. | |
| 2001/0035572 A1 * | 11/2001 | Isaak | H01L 23/3121 257/678 |
| 2002/0047978 A1 * | 4/2002 | Fukuta | G02F 1/13452 349/149 |
| 2003/0173663 A1 * | 9/2003 | Kami | G02B 6/4201 257/728 |
| 2004/0063001 A1 | 4/2004 | Wu et al. | |
| 2004/0113250 A1 * | 6/2004 | Khandros | H01L 23/13 257/680 |
| 2004/0119787 A1 * | 6/2004 | Mori | B41J 2/14024 347/57 |
| 2004/0161010 A1 | 8/2004 | Matsumura | |
| 2005/0012199 A1 * | 1/2005 | Rosenau | G02B 6/4201 257/696 |
| 2005/0140273 A1 | 6/2005 | Guo et al. | |
| 2005/0285990 A1 | 12/2005 | Havelka et al. | |
| 2006/0026521 A1 | 2/2006 | Hotelling et al. | |
| 2006/0043318 A1 | 3/2006 | Kodera | |
| 2006/0061241 A1 * | 3/2006 | Sasaki | H01L 41/0474 310/366 |
| 2006/0192277 A1 * | 8/2006 | RaghuRam | H01L 23/49816 257/686 |
| 2006/0197753 A1 | 9/2006 | Hotelling | |
| 2006/0283212 A1 * | 12/2006 | Wilson | A47L 13/60 68/84 |
| 2007/0001282 A1 * | 1/2007 | Kang | G11C 5/04 257/692 |
| 2007/0080433 A1 | 4/2007 | Lai | |
| 2007/0090506 A1 * | 4/2007 | Sundstrom | H01L 23/49827 257/686 |
| 2007/0148831 A1 | 6/2007 | Nagata et al. | |
| 2007/0173031 A1 | 7/2007 | Kodaira et al. | |
| 2008/0117376 A1 | 5/2008 | Takenaka | |
| 2008/0129761 A1 | 6/2008 | Kim et al. | |
| 2008/0158498 A1 | 7/2008 | Chang et al. | |
| 2008/0185705 A1 * | 8/2008 | Osborn | H01L 23/49811 257/690 |
| 2008/0241549 A1 | 10/2008 | Seon et al. | |
| 2008/0248191 A1 | 10/2008 | Daniels | |
| 2009/0001380 A1 | 1/2009 | Yang et al. | |
| 2009/0027896 A1 | 1/2009 | Nishimura et al. | |
| 2009/0051640 A1 | 2/2009 | Tanaka et al. | |
| 2009/0148678 A1 | 6/2009 | Hwang | |
| 2009/0167171 A1 | 7/2009 | Jung et al. | |
| 2009/0201635 A1 | 8/2009 | Kim et al. | |
| 2009/0256471 A1 | 10/2009 | Kim et al. | |
| 2009/0284688 A1 | 11/2009 | Shiraishi et al. | |
| 2010/0007817 A1 | 1/2010 | Kim | |
| 2010/0026952 A1 | 2/2010 | Miura et al. | |
| 2010/0044685 A1 | 2/2010 | Kim | |
| 2010/0225624 A1 | 9/2010 | Fu et al. | |
| 2010/0226103 A1 * | 9/2010 | Muro | G06F 1/1616 361/749 |
| 2010/0315399 A1 | 12/2010 | Jacobson et al. | |
| 2011/0006301 A1 | 1/2011 | Yamazaki et al. | |
| 2011/0007042 A1 | 1/2011 | Miyaguchi | |
| 2011/0086680 A1 | 4/2011 | Kim et al. | |
| 2011/0132643 A1 * | 6/2011 | Hattori | C22F 1/08 174/254 |
| 2011/0227064 A1 | 9/2011 | Park et al. | |
| 2011/0227086 A1 | 9/2011 | French | |
| 2011/0227846 A1 | 9/2011 | Imazeki | |
| 2011/0250435 A1 | 10/2011 | Ge et al. | |
| 2011/0261040 A1 | 10/2011 | Han | |
| 2011/0272181 A1 | 11/2011 | Koo et al. | |
| 2012/0056173 A1 | 3/2012 | Pieralisi | |
| 2012/0062447 A1 | 3/2012 | Tseng et al. | |
| 2012/0127087 A1 | 5/2012 | Ma | |
| 2012/0146886 A1 | 6/2012 | Minami et al. | |
| 2012/0175607 A1 | 7/2012 | Shu et al. | |
| 2012/0186859 A1 * | 7/2012 | Yamashita | H05K 1/118 174/254 |
| 2012/0218219 A1 * | 8/2012 | Rappoport | H01L 27/3276 345/174 |
| 2012/0242588 A1 | 9/2012 | Myers et al. | |
| 2012/0243151 A1 | 9/2012 | Lynch et al. | |
| 2012/0248451 A1 | 10/2012 | Sone et al. | |
| 2012/0307423 A1 | 12/2012 | Bohn et al. | |
| 2013/0020731 A1 | 1/2013 | Kim et al. | |
| 2013/0021289 A1 | 1/2013 | Chen et al. | |
| 2013/0069061 A1 | 3/2013 | Nakazawa | |
| 2013/0076601 A1 | 3/2013 | Wang et al. | |
| 2013/0081756 A1 | 4/2013 | Franklin et al. | |
| 2013/0082984 A1 | 4/2013 | Drzaic et al. | |

(56) References Cited

U.S. PATENT DOCUMENTS

| | | | |
|---|---|---|---|
| 2013/0088671 A1* | 4/2013 | Drzaic | G02F 1/13452 349/106 |
| 2013/0140965 A1 | 6/2013 | Franklin et al. | |
| 2013/0161622 A1 | 6/2013 | Lee | |
| 2013/0333919 A1* | 12/2013 | Nguyen | H05K 9/0015 174/126.1 |
| 2013/0342099 A1* | 12/2013 | Weber | H05B 33/02 313/498 |
| 2014/0042406 A1* | 2/2014 | Degner | H01L 27/326 257/40 |
| 2014/0042427 A1 | 2/2014 | Hung et al. | |
| 2014/0049500 A1 | 2/2014 | Chen et al. | |
| 2014/0055702 A1 | 2/2014 | Park et al. | |
| 2014/0092338 A1 | 4/2014 | Miyazaki et al. | |
| 2014/0197531 A1 | 7/2014 | Bolognia | |
| 2014/0217373 A1 | 8/2014 | Youn et al. | |
| 2014/0232956 A1 | 8/2014 | Kwon et al. | |
| 2016/0085125 A1 | 3/2016 | Park et al. | |

FOREIGN PATENT DOCUMENTS

| | | |
|---|---|---|
| EP | 2341759 | 7/2011 |
| JP | 9321083 | 12/1997 |
| JP | 2000163031 | 6/2000 |
| JP | 2001102595 | 4/2001 |
| JP | 2002342033 | 11/2002 |
| JP | 2003057661 | 2/2003 |
| JP | 2004119871 | 4/2004 |
| JP | 2005079472 | 3/2005 |
| JP | 2005303220 | 10/2005 |
| JP | 2007227875 | 9/2007 |
| JP | 2009048007 | 3/2009 |
| JP | 2009094099 | 4/2009 |
| JP | 2010060866 | 3/2010 |
| JP | 2012128006 | 7/2012 |
| KR | 20090093859 | 9/2009 |
| KR | 100961268 | 6/2010 |
| TW | 200712705 | 5/2007 |
| TW | 200705001 | 2/2010 |
| TW | 201230343 | 7/2012 |
| WO | 9604682 | 2/1996 |
| WO | 0169577 | 9/2001 |
| WO | 2008001051 | 1/2008 |
| WO | 2011049182 | 4/2011 |
| WO | 2011071198 | 6/2011 |
| WO | 2011151970 | 12/2011 |
| WO | 2012078040 | 6/2012 |

OTHER PUBLICATIONS

Kim et al., "Optimized Structural Designs for Stretchable Silicon Integrated Circuits" Small Journal, vol. 5, Issue No. 24, 2009, p. 2841-2847, Retrieved from the internet on Aug. 4, 2015 <http://rogers.matse.illinois.edu/files%5C2009%5Coptimizedsmall.pdf>. DOI: 10.1002/smll.200900853.

Lu et al., "Metal films on polymer substrates stretched beyond 50%" Applied Physics Letters, vol. 91, Issue No. 221909, 2007, American Institute of Physics, Retrieved from the internet on Aug. 4, 2015 <http://www.seas.harvard.edu/suo/papers/201.pdf>. DOI: 10.1063/1.2817234.

Lu et al., "The effect of film thickness on the failure strain of polymer-supported metal films" School of Engineering and Applied Sciences, vol. 58, Issue No. 5, Mar. 2010, pp. 1679-1687, Acta Materialia Inc. Published by Elsevier Ltd., Retrieved from the internet on Aug. 5, 2015 <http://www.seas.harvard.edu/suo/papers/223.pdf>. DOI: 10. 10161j.actamat.2009. 11.010.

Verplancke et al., "Thin-film stretchable electronics technology based on meandering interconnections: fabrication and mechanical performance" Journal of Micromechanics and Microengineering, vol. 22, Issue No. 015002, Dec. 8, 2011, IOP Publishing Ltd, Retrieved from the internet on Aug. 4, 2015 <http://www.researchgate.net/publication/231065132_Thin_film_stretchable_electronics_technology_based_on_meandering_interconnections_fabrication_and_mechanical_performance>. DOI:10.1088/0960-1317/22/1/015002.

Kim et al., "Stretchable Electronics: Materials Strategies and Devices" Advanced Materials, vol. 20, 2008, pp. 4887-4892, Retrieved from the internet on Aug. 4, 2015 <http://rogers.matse.illinois.edu/files/2008/advmatstrnews.pdf>. DOI: 10.1002/adma.200801788.

Vanfleteren et al., "Printed circuit board technology inspired stretchable circuits" MRS Bulletin, vol. 37, Mar. 2012, pp. 254-259, Materials Research Society, Retrieved from the internet on Aug. 4, 2015 <http://www.researchgate.net/publication/237079563_Printed_circuit_board_technology_inspired_stretchable_circuits>. DOI: 10.1557/mrs.2012.48.

Westerman, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.

Rubine, D.H., (Dec. 1991). "The automatic recognition of gestures," CMU-CS-91-202, Submitted in partial fulfillment of the requirements for the degree of doctor of philosophy in computer science at Carnegie Mellon [ University, 285 pages.

Rubine, D.H. (May 1992). "Combining gestures and direct manipulation," CHI 92, pp. 659-660.

International Search Report and Written Opinion dated May 6, 2014, PCT/US2013/066153, 17 pages.

Invitation to Pay Additional Fees dated Feb. 10, 2014, PCT/US2013/066156, 7 pages.

Westermand, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.

Lee, S.K. et al., (Apr. 1985). "A multi-touch three dimensional touch-sensitive tablet," Proceedings of CHI: ACM Conference on Human Factors in Computing Systems, pp. 21-25.

* cited by examiner

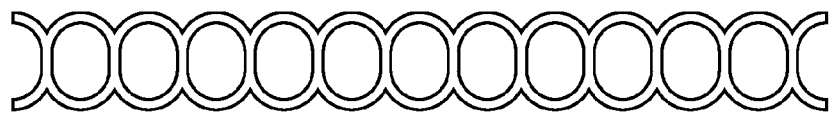
FIG. 24
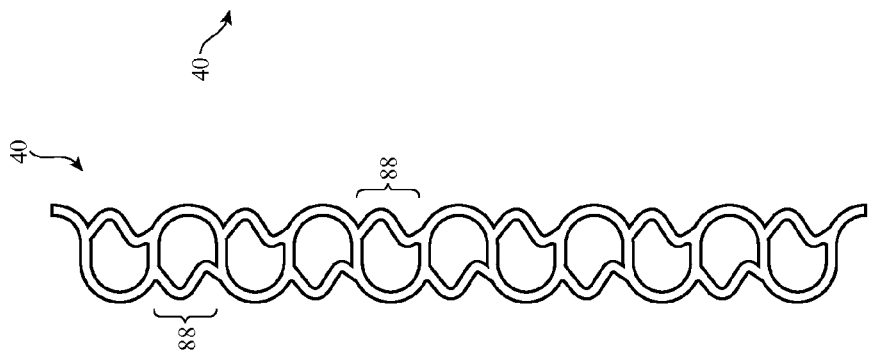
FIG. 23
FIG. 22
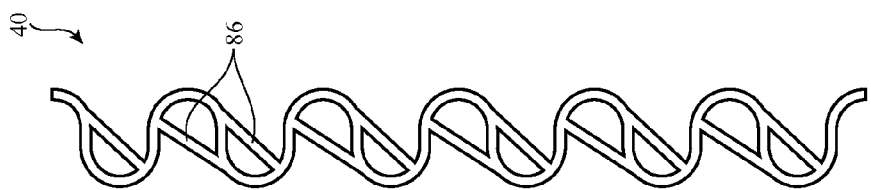
FIG. 21
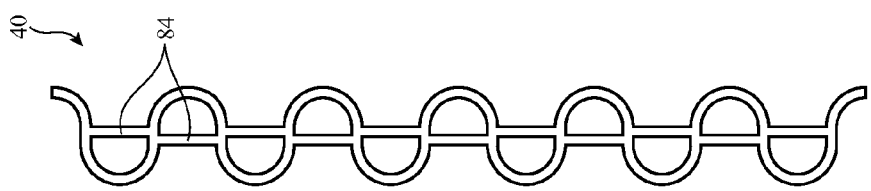
FIG. 20
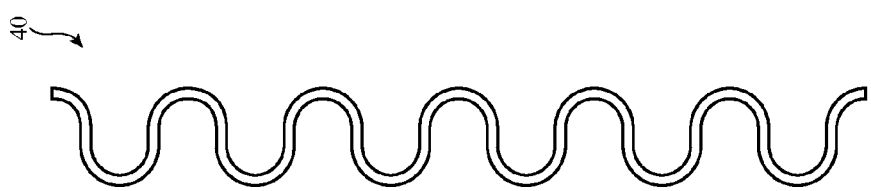

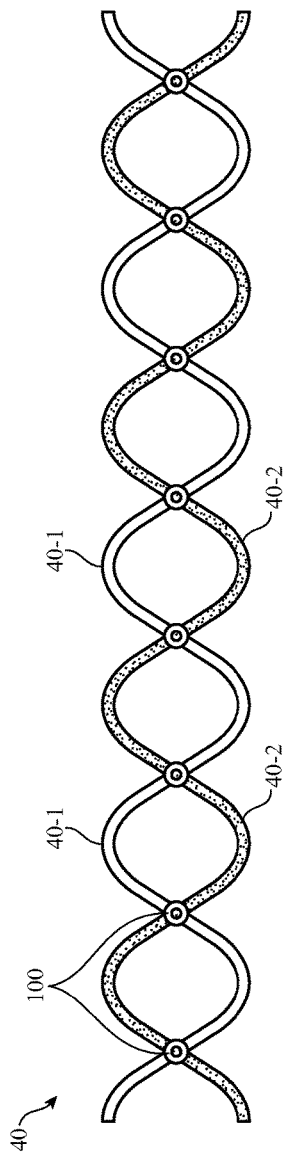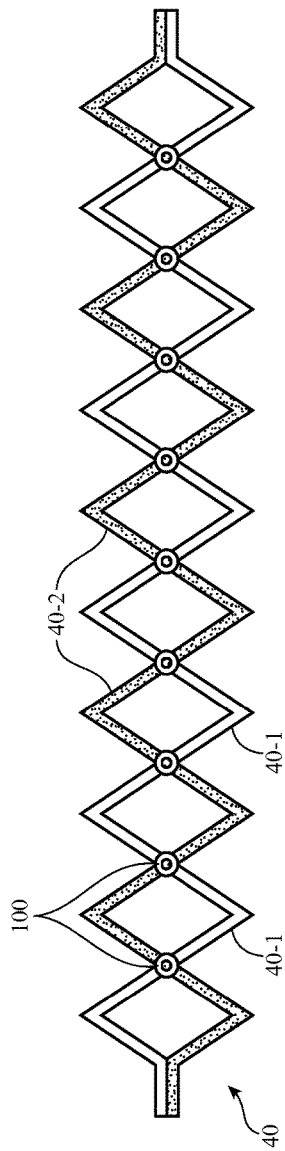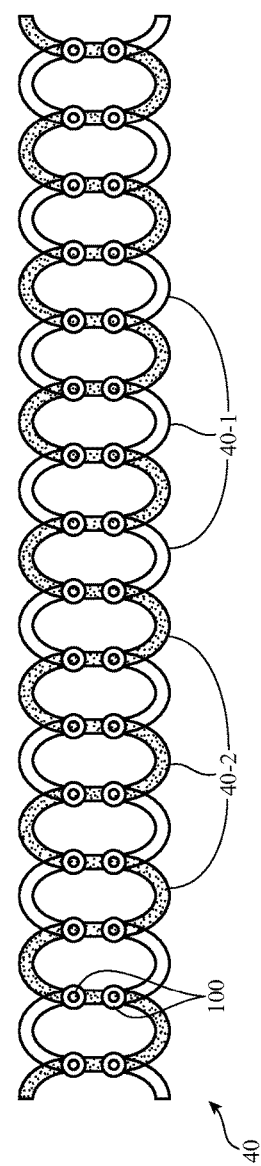

SIGNAL TRACE PATTERNS FOR FLEXIBLE SUBSTRATES

BACKGROUND

This relates generally to electronic devices, and, more particularly, to flexible substrates in electronic devices.

Electronic devices such as cellular telephones, computers, and other electronic equipment often contain flexible substrates. The ability to bend a flexible substrate allows the substrate to be used in situations in which rigid substrates would be difficult or impossible to use.

Flexible substrates may be used for components such as displays and touch sensors. Flexible substrates may also be used in forming flexible printed circuits. Flexible printed circuits may be used to interconnect electrical components and can be used in forming signal bus cables. Signal traces may be formed on these flexible substrates to carry signals.

Challenges can arise when the traces on a flexible substrate are bent. If care is not taken, bending stress will give rise to trace cracks or other faults that can disrupt the ability of the traces to reliably carry signals.

It would therefore be desirable to be able to provide improved techniques for facilitating the bending of flexible substrates with signal traces.

SUMMARY

A flexible substrate may have one or more bends. A portion of the substrate may form a display with an array of pixels. Flexible substrates may also be used in forming touch sensors, displays with integrated touch sensor electrodes, and flexible printed circuits.

A bend in a flexible substrate may be made along a bend axis. The bend may be located in an inactive area of a display or in another region of the flexible substrate.

Conductive traces in the flexible substrate may have elongated shapes. Each conductive trace may extend along a longitudinal axis that is perpendicular to the bend axis. Metal or other conductive materials may form the conductive traces.

The traces may each be formed from a chain of linked segments. Each segment may have patterned trace portions that surround one, two, or more than two openings. Serpentine patterns, zigzag patterns, and other trace patterns may be used in forming the traces. A polymer layer may cover the traces to align a neutral stress plane with the traces and to serve as a moisture barrier layer.

Traces may be formed that have multiple layers of metal or other conductive material that are interconnected using vias.

BRIEF DESCRIPTION OF THE DRAWINGS

FIG. 20 is a diagram of an illustrative serpentine trace that may be used in the bent region of a flexible substrate in accordance with an embodiment.

FIG. 21 is a diagram of an illustrative trace of the type shown in FIG. 20 with longitudinal redundant lines in accordance with an embodiment.

FIG. 22 is a diagram of an illustrative trace of the type shown in FIG. 20 with angled longitudinal redundant lines in accordance with an embodiment.

FIG. 23 is a diagram of an illustrative trace of the type shown in FIG. 20 with serpentine redundant lines in accordance with an embodiment.

FIG. 24 is a diagram of an illustrative trace of the type shown in FIG. 20 with a chain-shaped trace pattern having multiple joined circular traces in accordance with an embodiment.

FIG. 27 is a diagram of a two layer trace pattern with interweaved sine wave traces in accordance with an embodiment.

FIG. 28 is a diagram of a two layer zigzag trace pattern in accordance with an embodiment.

FIG. 29 is a diagram of a two layer trace having oval-shaped segments in accordance with an embodiment.

DETAILED DESCRIPTION

Figure 1:
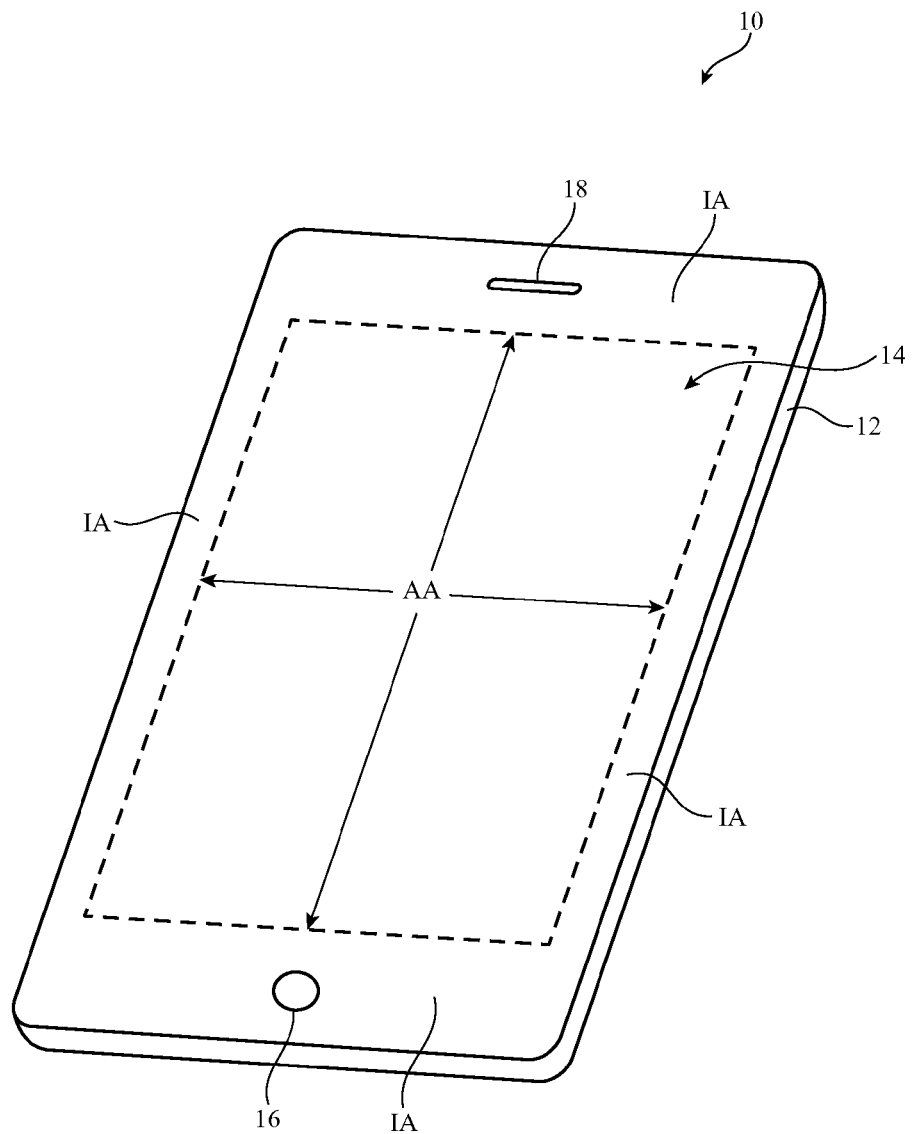
FIG. 1 is a perspective view of an illustrative electronic device in accordance with an embodiment.

An electronic device such as electronic device 10 of FIG. 1 may contain flexible substrates. Conductive traces on the flexible substrates may be used to carry signals. The conductive traces may be bent when a portion of the flexible substrate is bent. The conductive traces may be provided with patterns that resist damage during bending.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports (e.g., an audio jack port, a digital data port, etc.), to form openings for buttons, etc.

Display 14 may include an array of display pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. The array of pixels of display 14 forms an active area AA. Active area AA is used to display images for a user of device 10. Active area AA may be rectangular or may have other suitable shapes. Inactive border area IA may run along one or more edges of active area AA. Inactive border area IA may contain circuits, signal lines, and other structures that do not emit light for forming images.

It may sometimes be desirable to bend flexible substrates within device 10 to minimize inactive area IA for aesthetic reasons, to accommodate components within device 10, or to satisfy other design constraints. A flexible substrate that forms part of display 14 may, for example, be bent along one or more of its edges to minimize inactive area IA (e.g., to make display 14 borderless or nearly borderless or to otherwise help accommodate display 14 within device 10). Touch sensor substrates, substrates that include integrated display and touch sensor components, flexible printed circuits, and other flexible substrates may be bent.

Figure 2:
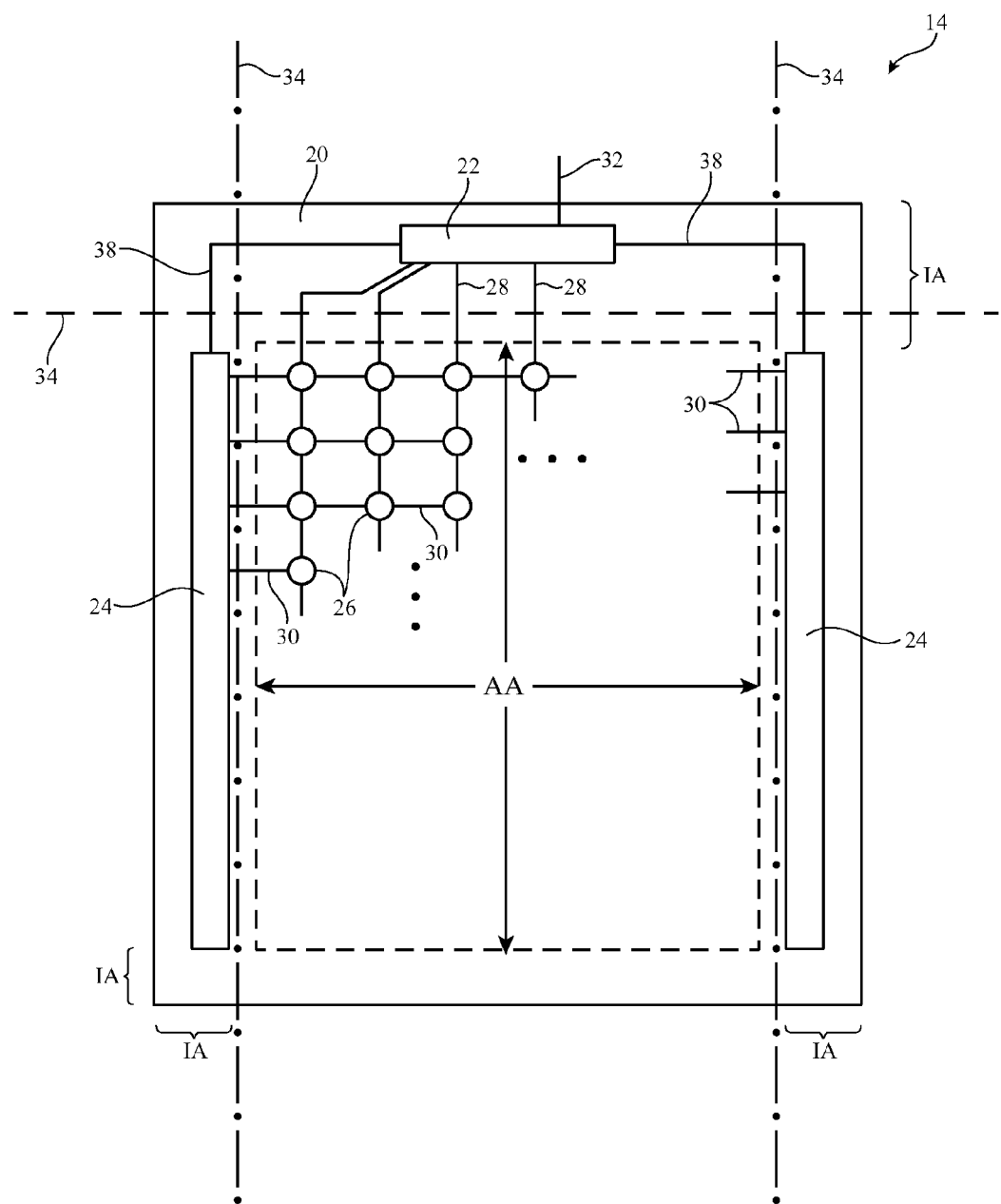
FIG. 2 is a top view of an illustrative electronic device display with a flexible substrate in accordance with an embodiment.

An illustrative display for device 10 is shown in FIG. 2. As shown in FIG. 2, display 14 may include layers such as flexible substrate layer 20. Substrate layers such as layer 20 may be formed from one or more layers of flexible polymer or other flexible materials. Flexible substrate 20 may have left and right vertical edges and upper and lower horizontal edges. If desired, substrates such as substrate 20 may have non-rectangular shapes (e.g., shapes with curved edges, rectangular shapes and other shapes with protrusions that form flexible tails, etc.).

Display 14 may have an array of pixels 26 for displaying images for a user. Each pixel may, for example, have a light-emitting diode (e.g., an organic light-emitting diode). Pixels 26 may be arranged in rows and columns. There may be any suitable number of rows and columns in the array of pixels 26 (e.g., ten or more, one hundred or more, or one thousand or more). Display 14 may include pixels 26 of different colors. As an example, display 14 may include red pixels that emit red light, green pixels that emit green light, blue pixels that emit blue light, and white pixels that emit white light. Configurations for display 14 that include pixels of other colors may be used, if desired.

Display driver circuitry may be used to control the operation of pixels 26. The display driver circuitry may be formed from integrated circuits, thin-film transistor circuits, or other suitable circuitry. As shown in FIG. 2, display 14 may have display driver circuitry such as circuitry 22 that contains communications circuitry for communicating with system control circuitry over path 32. Path 32 may be formed from traces on a flexible printed circuit or other cable. If desired, some or all of circuitry 22 may be mounted on a substrate that is from substrate 20. The control circuitry with which circuitry 22 communicates may be located on one or more printed circuits in electronic device 10. During operation, the control circuitry may supply display 14 with information on images to be displayed on display 14 by pixels 26.

To display the images on pixels 26, display driver circuitry 22 may supply corresponding image data to data lines 28 while issuing clock signals and other control signals to supporting display driver circuitry such as gate driver circuitry 24 using signal lines 38. Data lines 28 are associated with respective columns of display pixels 26. Gate driver circuitry 24 (sometimes referred to as scan line driver circuitry) may be implemented as part of an integrated circuit and/or may be implemented using thin-film transistor circuitry on substrate 20. Horizontal signal lines such as gate lines 30 (sometimes referred to as scan lines or horizontal control lines) run horizontally through display 14. Each gate line 30 is associated with a respective row of pixels 26. If desired, there may be multiple horizontal control lines such as gate lines 30 associated with each row of pixels 26. Gate driver circuitry 24 may be located on the left side of display 14, on the right side of display 14, or on both the right and left sides of display 14, as shown in FIG. 2.

To minimize the footprint of display 14, it may be desirable to bend portions of substrate 20 along one or more bend axis 34. It may also be desirable to bend a flexible substrate such as substrate 20 in situations in which substrate 20 forms part of other device structures (e.g., part of a touch sensor substrate that carries an array of capacitive touch sensor electrodes, part of a touch screen display that has both capacitive touch sensor electrodes and display pixel structures on a common substrate layer, part of a flexible printed circuit cable, part of a flexible printed circuit on which integrated circuits and other devices have been mounted, or part of other device structures).

Figure 3:
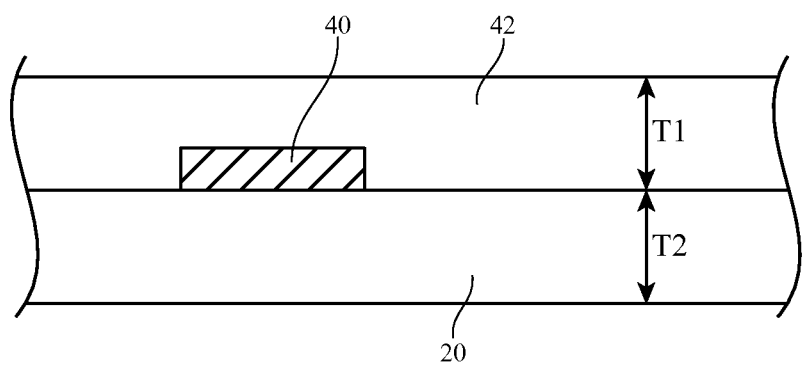
FIG. 3 is a cross-sectional view of a conductive trace on a flexible substrate that has been coated with a layer of material such as polymer in accordance with an embodiment.

The bending of flexible substrate 20 creates bends in the conductive traces on substrate 20. To help prevent damage to the conductive traces on substrate 20 during bending, it may be desirable to cover these traces with a coating layer such as a layer of polymer. As shown in FIG. 3, for example, conductive trace 40 (e.g., traces 28, 38, 30 or other traces) on flexible substrate 20 may be covered with a dielectric layer such as polymer layer 42.

Conductive traces such as trace 40 may be formed from metal (e.g., copper, aluminum, silver, gold, molybdenum, etc.) or conductive polymer. The traces can be passivated. The conductive traces may, if desired, be formed from multilayer stacks of metals or other materials (e.g., titanium/aluminum/titanium, etc.). Conductive traces 40 may also be formed from other types of coated or printed materials such as silver nanowires, conductive inks such as silver inks or other metal inks, carbon nanotubes, carbon inks, etc.

Substrate layer 20 may be a sheet of polyimide, polyester, polyethylene napthalate, or other polymer. Substrate layer 20 may also be formed from composite films, metal foils, thin glass, or combinations of these materials. Polymer coating layer 42 may be a high performance polymer barrier film that provides corrosion protection or other suitable flexible polymer layer. The thicknesses T1 and T2 of layers 42 and 20 may be selected so that the neutral stress plane of the stack of layers in FIG. 3 is aligned with trace 40, thereby helping to minimize stress when traces 40 are bent.

Figure 4:
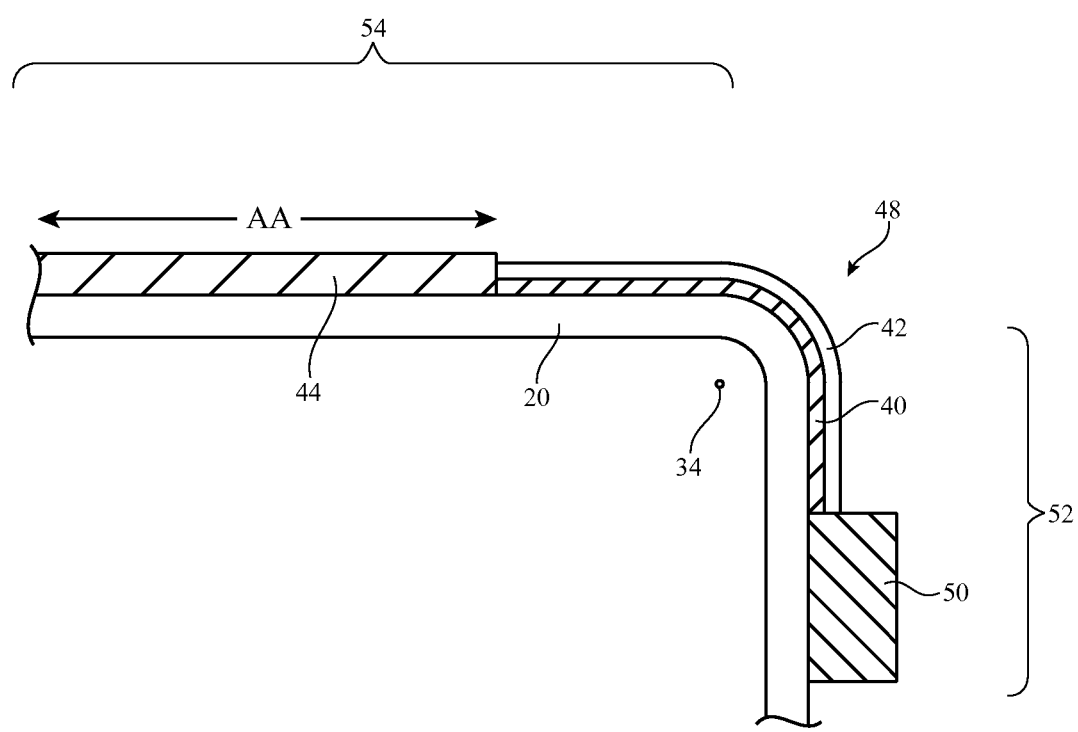
FIG. 4 is a cross-sectional side view of an illustrative flexible substrate with a bend in accordance with an embodiment.

FIG. 4 is a cross-sectional side view of a flexible substrate on which traces such as trace 40 have been bent. In the example of FIG. 4, flexible substrate 20 is part of a display (display 14) that has active area components 44 (e.g., pixels 26). This is merely illustrative. Flexible substrate 20 may form part of any suitable structure in device 10.

Substrate 20 may be planar (unbent) in main region 54 or may have a slight curve in region 54. Bent edge region 52 of substrate 20 may be bent downwards about bend axis 34 to form bend 48 in substrate 20. Conductive traces such as trace 40 and polymer coating 42 bend with substrate 20. Traces 40 may be elongated traces that extend along a dimension that is perpendicular to bend axis 34. Circuitry 50 (e.g., display driver circuitry, touch sensor circuity in a touch sensor, etc.) may be mounted on bent edge region 52 and/or a flexible printed circuit cable or other component may be attached to substrate 20 in bent edge region 52.

Figure 5:
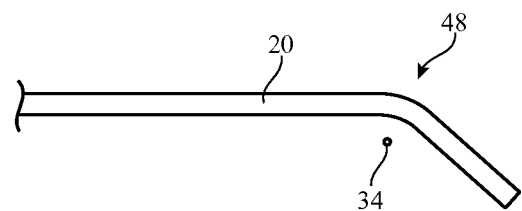
FIG. 5 is a cross-sectional side view of an illustrative flexible substrate with a bend that has been made at less than a right angle in accordance with an embodiment.
Figure 6:
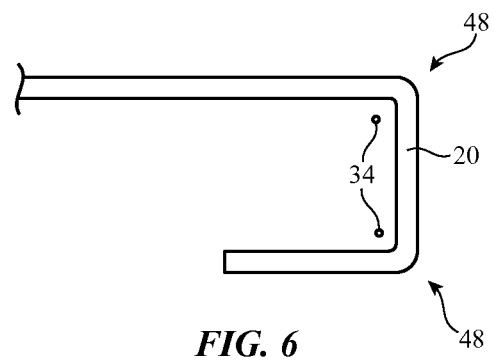
FIG. 6 is a cross-sectional side view of an illustrative flexible substrate with two right-angle bends in accordance with an embodiment.
Figure 7:
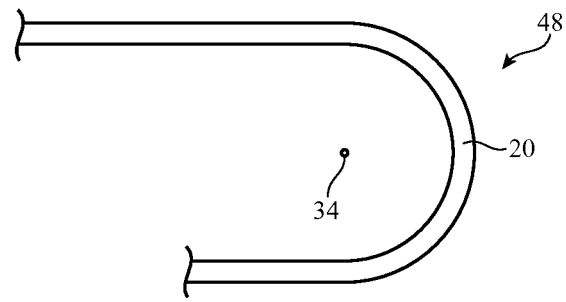
FIG. 7 is a cross-sectional side view of an illustrative flexible substrate with a curved bend in accordance with an embodiment.

Substrate 20 may be bent along one or more edges and/or along one or more bend axes. In the example of FIG. 5, substrate 20 has been bent sufficiently to ease the edge of substrate 20, but the bend angle of bend 48 is less than a right angle. In FIG. 6, there are two bends 48 each formed by bending a portion of substrate 20 about a different respective bend axis 34. FIG. 7 shows how substrate 20 may be bent about bend axis 34 to form a 180° bend. The examples of FIGS. 4, 5, 6, and 7 are merely illustrative. Any suitable type of bend may be formed in flexible substrate 20, if desired.

To help accommodate bending without cracking the metal or other conductive material used in forming trace 40, trace 40 may be provided with a shape that accommodates bends. Illustrative trace patterns that may help accommodate bending in traces such as trace 40 without damaging the bent traces are shown in FIGS. 8-24 and 26-29. Other trace patterns to minimize damage during bending may be used, if desired.

Figure 8:
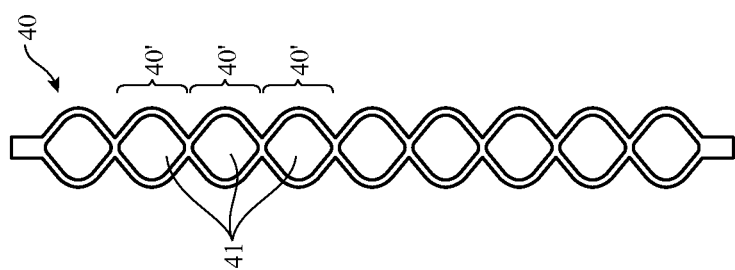
FIG. 8 is a diagram of an illustrative double sine wave trace pattern that may be used in the bent region of a flexible substrate in accordance with an embodiment.

FIG. 8 is a diagram of an illustrative double sine wave trace pattern that may be used for trace 40 in the bent region of flexible substrate 20. In the illustrative configuration of FIG. 8 and other illustrative configurations, trace 40 has a series of interconnected (and electrically shorted) loop-shaped segments 40' each of which surrounds at least one opening 41 (or more than one opening 41). This forms a chain of electrically connected segments 40'. The shape of each section 40' of trace 40 (i.e., a shape with one or more interior openings) provides redundancy due to parallelism between the portions of the trace in each section 40'. This parallelism helps ensure that trace 40 can continue to satisfactorily carry signals even in the presence of a bend.

Figure 9:
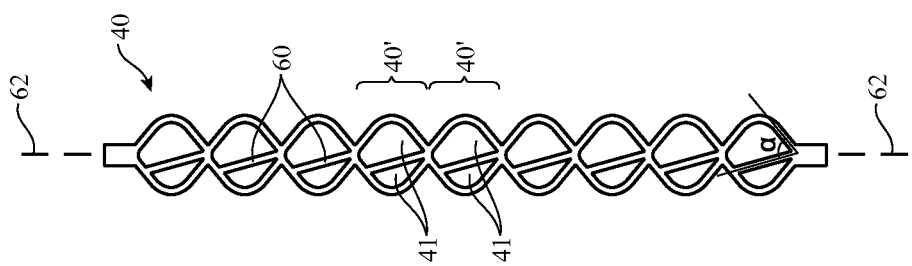
FIG. 9 is a diagram of an illustrative trace of the type shown in FIG. 8 with an angled longitudinal redundant metal line feature in accordance with an embodiment.

FIG. 9 is a diagram of an illustrative trace of the type shown in FIG. 8 with an angled longitudinal redundant metal line feature (redundant lines 60, which are angled slightly away from longitudinal axis 62 of trace 40). In configurations of the type shown in FIG. 9, there are two openings 41 in each section (segment) 40' of trace 40 (i.e., there are three parallel trace portions to provide redundancy).

Figure 10:
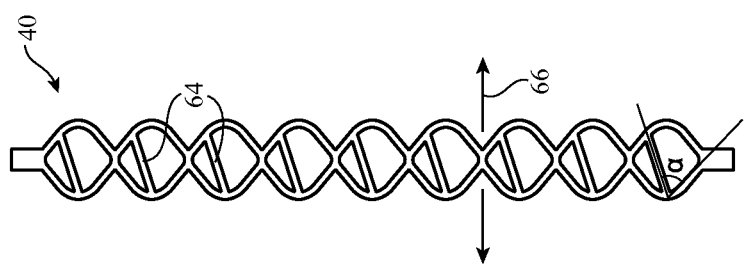
FIG. 10 is a diagram of an illustrative trace of the type shown in FIG. 8 with an angled lateral redundant metal line feature in accordance with an embodiment.

FIG. 10 is a diagram of an illustrative trace of the type shown in FIG. 8 with an angled lateral redundant metal line feature (redundant lines 64, which are angled slightly away from lateral dimension 66.

If desired, angles a of FIGS. 9 and 10 may vary. The examples of FIGS. 9 and 10 are illustrative.

Figure 11:
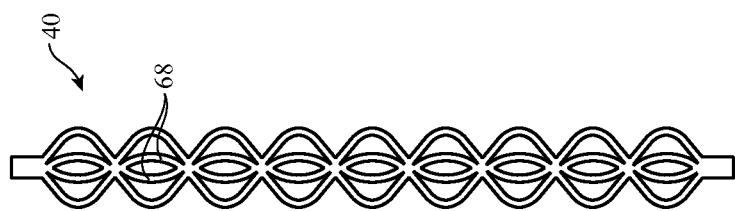
FIG. 11 is a diagram of an illustrative double sine wave trace with a pair of interior longitudinal redundant lines in accordance with an embodiment.

In the example of FIG. 11, each segment of a double sine wave trace has been provided with a pair of interior longitudinal redundant lines 68 to form trace 40.

Figure 12:
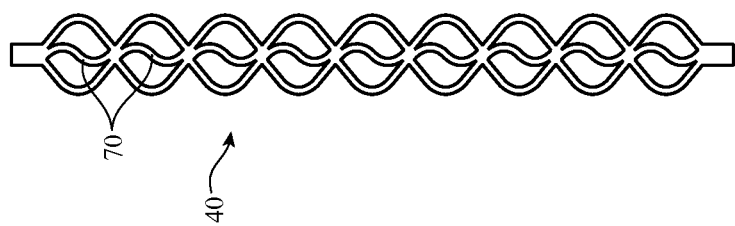
FIG. 12 is a diagram of an illustrative double sine wave trace with a single longitudinal serpentine redundant trace in accordance with an embodiment.

In the example of FIG. 12, a double sine wave trace has been provided with longitudinal serpentine redundant trace portions 70 to form trace 40.

Figure 13:
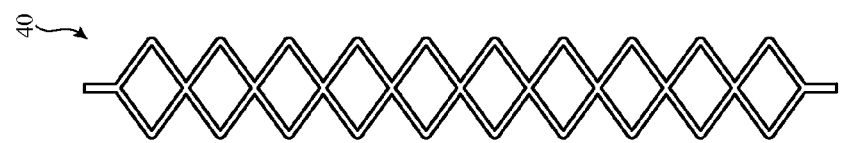
FIG. 13 is a diagram of a double zigzag trace that may be used in the bent region of a flexible substrate in accordance with an embodiment.

In the example of FIG. 13, trace 40 has a double zigzag pattern.

In the examples of FIGS. 14, 15, 16, and 17, lines 72, 74, 76, and 78 are respectively used to provide redundancy to trace 40. Angle a of FIGS. 14 and 16 may vary, if desired.

Figure 18:
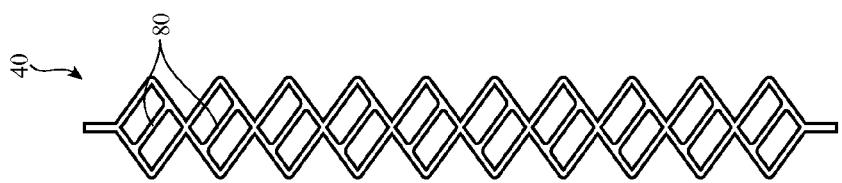
FIG. 18 is a diagram of a trace pattern of the type shown in FIG. 13 with diagonal redundant lines in accordance with an embodiment.
Figure 17:
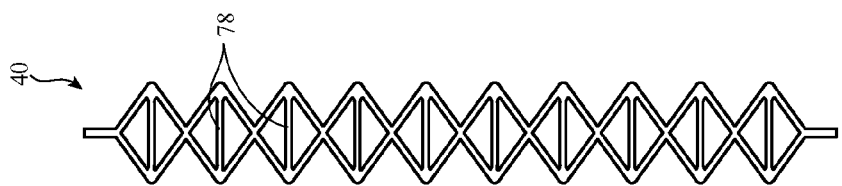
FIG. 17 is a diagram of a trace pattern of the type shown in FIG. 13 with lateral redundant lines in accordance with an embodiment.
Figure 16:
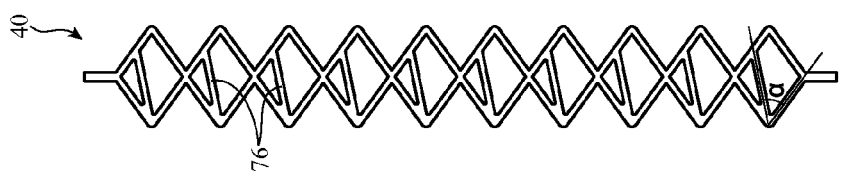
FIG. 16 is a diagram of a trace pattern of the type shown in FIG. 13 with laterally oriented angled redundant lines in accordance with an embodiment.
Figure 15:
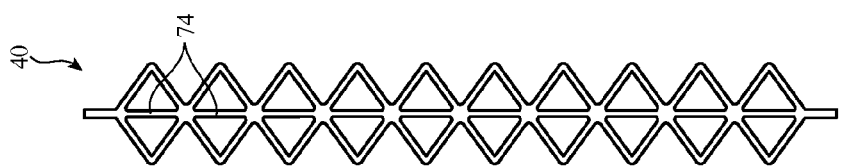
FIG. 15 is a diagram of a trace pattern of the type shown in FIG. 13 with a straight longitudinal redundant line in accordance with an embodiment.
Figure 14:
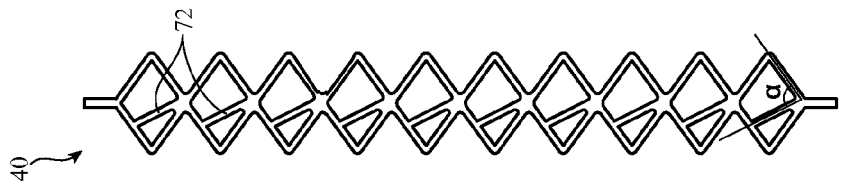
FIG. 14 is a diagram of a trace pattern of the type shown in FIG. 13 with an angled longitudinal redundant line in accordance with an embodiment.

FIG. 18 is a diagram of trace 40 in a configuration in which segments 80 run diagonally across each section of trace 40.

Figure 19:
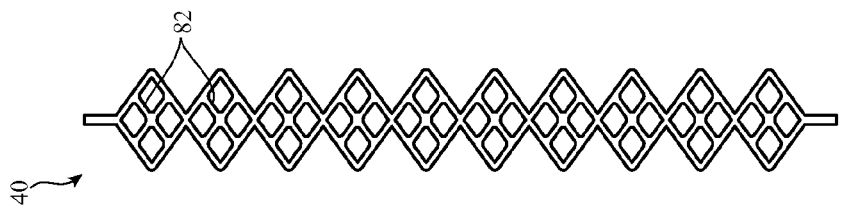
FIG. 19 is a diagram of a trace pattern of the type shown in FIG. 13 with diagonal cross-shaped redundant patterned traces in accordance with an embodiment.

FIG. 19 shows how trace 40 may include cross-shaped redundant traces 82.

As shown in FIG. 20, trace 40 may have a serpentine shape.

In the arrangement of FIG. 21, the serpentine portion of trace 40 has been provided with vertical redundant trace segments 84.

In the arrangement of FIG. 22, redundant lines 86 run diagonally (at an angle with respect to the longitudinal axis of trace 40).

FIG. 23 is a diagram of trace 40 in an illustrative configuration in which a serpentine trace has been provided with redundant trace portions 88 that are themselves serpentine.

FIG. 24 is a diagram of trace 40 of a mirror imaged version of serpentine trace 40 of FIG. 20. In this type of arrangement, trace 40 forms a chain shape with circularly-shaped link segments.

Figure 25:
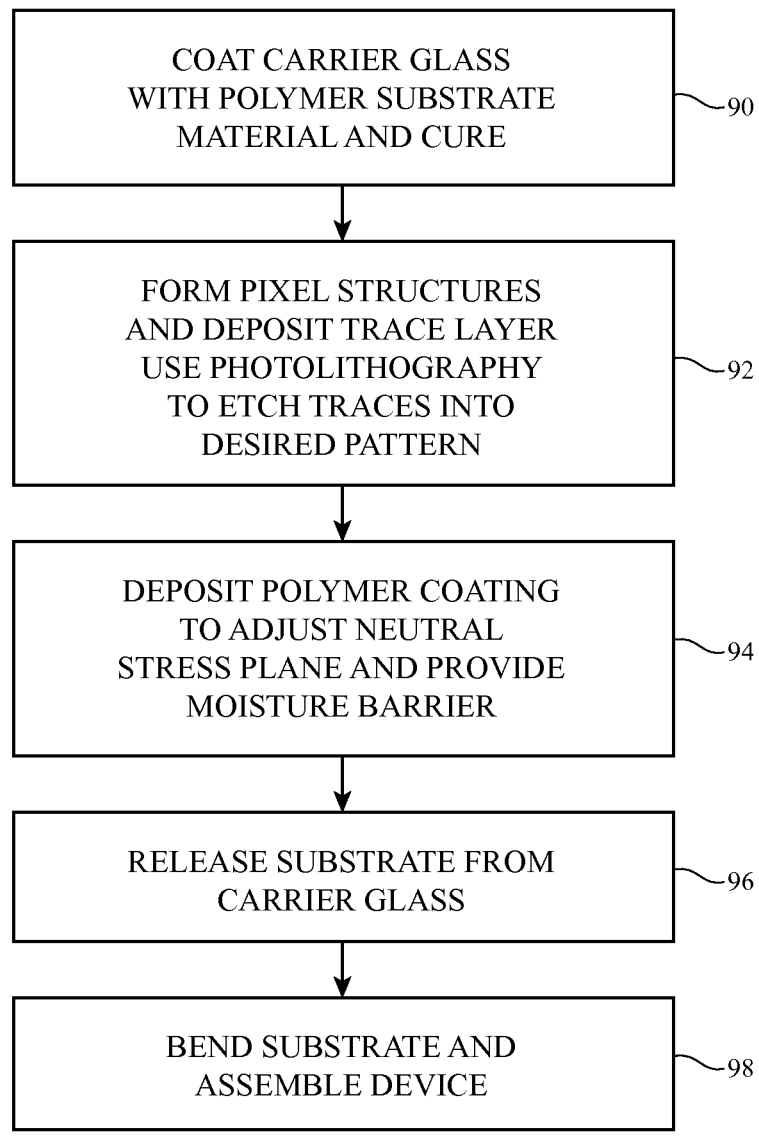
FIG. 25 is a flow chart of illustrative steps involved in forming traces for bent regions of flexible substrates in accordance with an embodiment.

FIG. 25 is a flow chart of illustrative steps involved in forming device 10 or other items with bent flexible substrates such as substrate 20.

At step 90, a glass carrier or other suitable support structure may be coated with a liquid polymer and cured. The cured polymer forms flexible substrate 20.

At step 92, photolithographic techniques, etching, and other techniques may be used in forming metal traces 40 with a desired pattern and other structures for flexible substrate 20 (e.g., pixel structures for pixels 26 in display 14, touch electrodes on a touch sensor, etc.).

After forming traces 40 of desired shapes (see, e.g., the examples of FIGS. 8-24 in which each elongated trace has a chain of segments each of which encloses one or two or more openings), a polymer coating such as coating 42 may be deposited on substrate 20 at step 94. Coating 42 may be deposited to a thickness that helps move the neutral stress plane of substrate 20 into alignment with traces 40, thereby minimizing stress on trace 40 during bending. Coating 42 may be formed form a moisture barrier polymer that helps prevent corrosion to metal and other materials of the type that may be used in forming traces 40.

At step 96, substrate 20 may be removed from the glass carrier.

At step 98, substrate 20 may be bent around bend axis 34 to form bend 48 (or multiple bends 48 may be formed). Substrate 20 may then be assembled within device 10 with other device structures to form a completed device 10.

Figure 26:
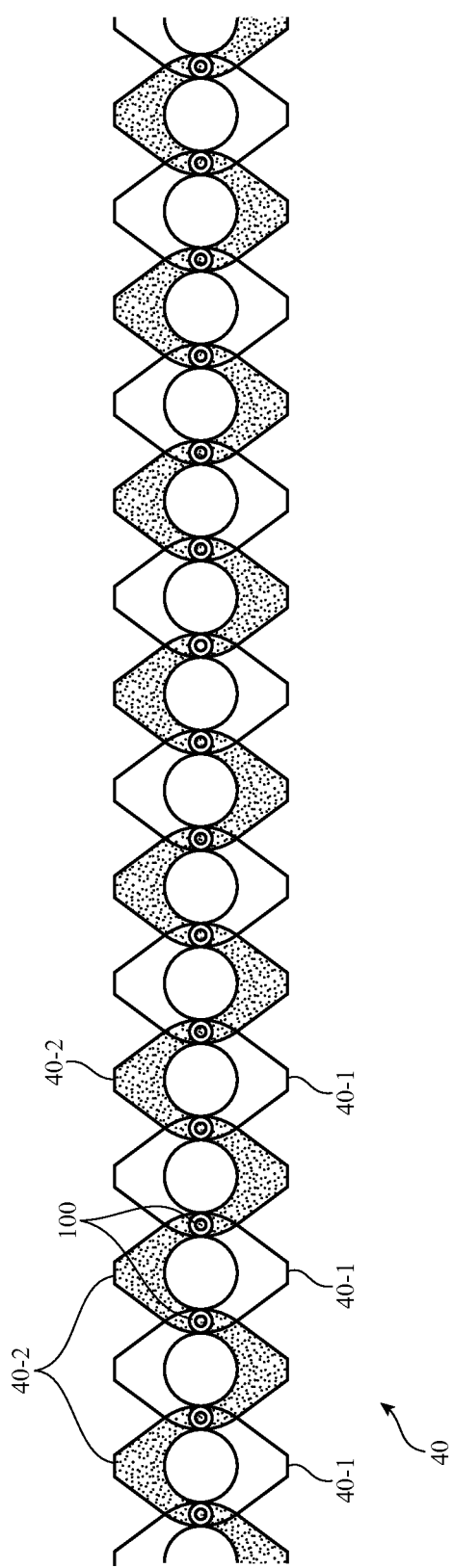
FIG. 26 is a diagram of an illustrative two-layer trace of "temple gate" traces that may be used in forming signal lines in bent portions of flexible substrates in accordance with an embodiment.

It may be desirable to provide signal trace redundancy by forming conductive trace 40 from multiple patterned layers of metal or other conductive material. FIG. 26 is a diagram of trace 40 in an illustrative configuration involving a first "temple gate" trace portion 40-1 (a first serpentine trace formed from a first layer of metal or other patterned conductive material on substrate 20) and a second "temple gate" trace portion 40-2 (a second serpentine trace formed from a second layer of metal or other patterned conductive material that is deposited and patterned after the first layer). A layer of polymer or other dielectric (sometimes referred to as interlayer dielectric) may be interposed between the layers that form traces 40-1 and 40-2 and may be interconnected by vias 100. Vias 100 may, for example, couple traces 40-1 and 40-2 at overlapping portions between traces 40-1 and 40-2 (e.g., at each intersection between traces 40-1 and 40-2).

In the example of FIG. 27, traces 40-1 and 40-2 are narrower than traces 40-1 and 40-2 of FIG. 26 and have a sinusoidal shape. Vias 100 may couple trace 40-1 (which lies in a first conductive layer) to trace 40-2 (which lies in a second conductive layer that is separated from the first layer by a layer of interposed dielectric).

In the example of FIG. 28, traces 40-1 and 40-2 have zigzag shapes.

FIG. 29 shows how multiple vias 100 may be used at each overlapping portion between traces 40-1 and 40-2.

The two-conductive-layer arrangements of FIGS. 26, 27, 28, and 29 are merely illustrative. If desired, additional layers of metal traces may be used in forming trace 40 (e.g., additional layers may be coupled together by additional conductive vias 100).

Figure 30:
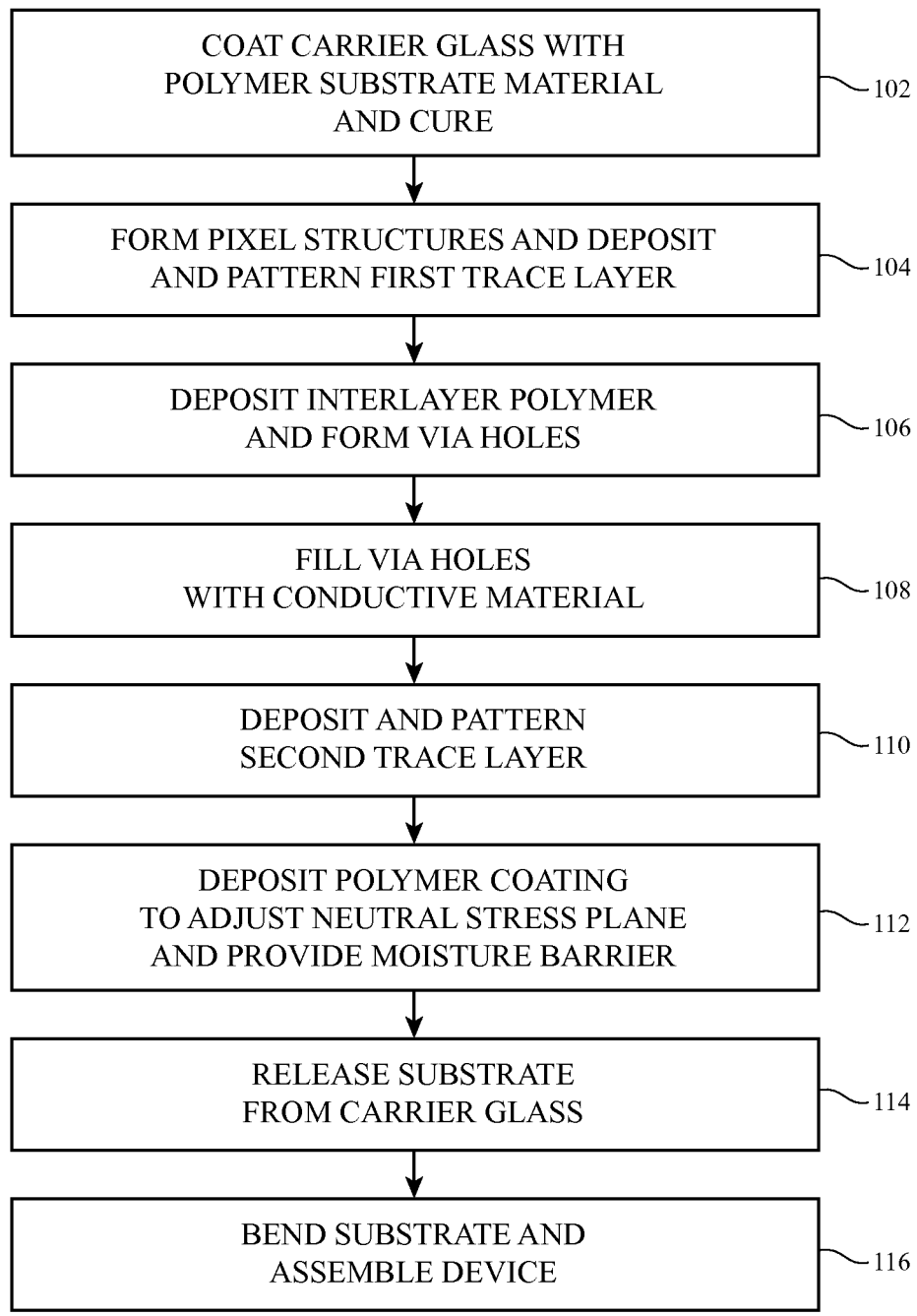
FIG. 30 is a flow chart of illustrative steps involved in forming multilayer traces for a bent portion of a flexible substrate in accordance with an embodiment.

FIG. 30 is a flow chart of illustrative steps involved in forming a multi-layer conductive trace 40.

At step 102, a glass carrier or other suitable support structure may be coated with a liquid polymer and cured. The cured polymer forms flexible substrate 20.

At step 104, photolithographic techniques, etching, and other fabrication processes may be used in patterning a first layer of conductive trace 40 (e.g., traces such as trace 40-1). Additional structures on substrate 20 may also be formed (e.g., pixel structures for pixels 26 in display 14, touch electrodes on a touch sensor, etc.).

After forming a first layer of traces 40-1 at step 104, a layer of polymer or other dielectric may be deposited on traces 40-1 and via holes for vias 100 may be formed through the polymer in alignment with traces 40-1 (step 106).

At step 108, the via holes may be filled with metal or other conductive material to form conductive vias 100.

At step 110, photolithographic techniques, etching, and other fabrication processes may be used in forming a second patterned layer of conductive trace 40 (e.g. trace 40-2). Trace 40-2 may be aligned with vias 100, so that vias 100 electrically connect layers 40-1 and 40-2 together, thereby forming conductive trace 40.

At step 112, polymer coating 42 may be deposited. The thickness of layer 42 may be adjusted so that the neutral stress plane of substrate 20 is aligned with conductive traces 40. If desired, layer 42 may be a moisture barrier layer that helps prevent moisture from reaching traces 40.

At step 114, substrate 20 may be removed from the glass carrier.

At step 116, substrate 20 may be bent around bend axis 34 to form bend 48 (or multiple bends 48 may be formed). Substrate 20 may then be assembled within device 10 with other device structures to form a completed device 10.

Figure 31:
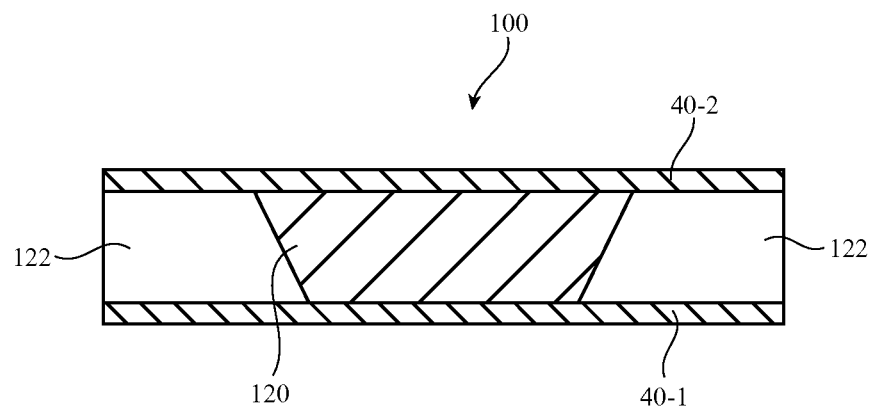
FIG. 31 is a cross-sectional side view of an illustrative plug via for interconnecting traces in a two-layer trace in accordance with an embodiment.
Figure 32:
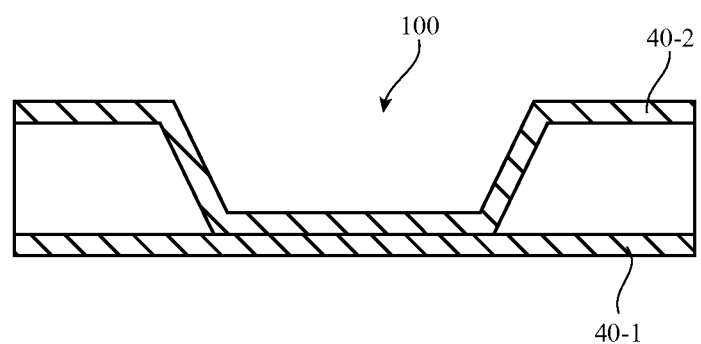
FIG. 32 is a cross-sectional side view of an illustrative contact via for interconnecting traces in a two-layer trace in accordance with an embodiment.

Vias 100 for interconnecting multilayer traces may be formed using any suitable via structures. FIG. 31 is a cross-sectional side view of an illustrative plug via for interconnecting traces in a two-layer trace. As shown in FIG. 31, dielectric layer 122 may separate upper trace 40-2 from lower trace 40-1. Plug via 100 may be formed from metal plug structure 120. Plug 120 may fill a via hole in dielectric 122. Plug via 100 of FIG. 31 may short traces 40-2 and 40-1 together as described in connection with traces 40 of FIGS. 26, 27, 28, and 29. FIG. 32 is a cross-sectional side view of an illustrative contact via. In the arrangement of FIG. 32, via 100 is formed from portions of upper trace 40-2 that fill a via hole in dielectric layer 122 and thereby electrically connect trace 40-2 to trace 40-1.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a flexible substrate layer having a bend;
   conductive traces on the flexible substrate layer that overlap the bend, wherein each conductive trace is formed from a chain of interconnected segments, each segment enclosing an opening having first and second opposing ends, wherein each conductive trace has a first portion formed in a first layer of metal and a second portion formed in a second layer of metal, wherein the first portion and the second portion have meandering shapes that intersect at the first and second opposing ends of each opening; and
   a plurality of metal vias that interconnect the first portion and the second portion, wherein the plurality of metal vias includes first and second metal vias that couple the first portion and the second portion at the first and second opposing ends of each opening.

2. The apparatus defined in claim 1 wherein the flexible substrate layer comprises a flexible polymer layer.

3. The apparatus defined in claim 2 wherein the conductive traces each extend along a longitudinal axis, wherein the bend is formed around a bend axis, and wherein the longitudinal axis of each trace is perpendicular to the bend axis.

4. The apparatus defined in claim 3 wherein the conductive traces comprise metal traces.

5. The apparatus defined in claim 4 further comprising pixels that contain light-emitting diodes on the flexible substrate layer.

6. The apparatus defined in claim 5 wherein the pixels are organized in an array of rows and columns forming an active area for a display in which images are produced and wherein the bend is formed in an inactive area of the display in which images are not produced.

7. The apparatus defined in claim 4 further comprising:
   a dielectric coating over the metal traces.

8. The apparatus defined in claim 7 wherein the dielectric coating has a thickness such that a neutral stress plane for the flexible substrate layer is aligned with the metal trace.

9. The apparatus defined in claim 8 wherein the dielectric coating is a moisture barrier coating.

10. An apparatus, comprising:
    a flexible polymer substrate having a bend; and
    conductive traces on the flexible polymer substrate that overlap the bend, wherein each conductive trace has a chain of interconnected sections, each section having a pattern of traces that encloses at least two openings, wherein each pattern of traces comprises first and second trace portions separated by a gap in which the at least two openings are enclosed, and a third trace portion that extends across the gap from the first trace portion to the second trace portion to separate the at least two openings from each other.

11. The apparatus defined in claim 10 wherein the conductive traces each extend along a longitudinal axis, wherein the bend is formed around a bend axis, and wherein the longitudinal axis of each trace is perpendicular to the bend axis.

12. The apparatus defined in claim 11 further comprising pixels that contain light-emitting diodes, wherein the conductive traces carry display signals.

13. The apparatus defined in claim 12 wherein the pixels are organized in an array of rows and columns that forms an active area for a display in which images are produced and wherein the bend is formed in an inactive area of display in which images are not produced.

14. The apparatus defined in claim 13 further comprising:
    a polymer coating over the conductive traces that serves as a moisture barrier.

15. A flexible structure that overlaps a bend axis, comprising:
    a flexible substrate layer that bends at the bend axis;
    conductive traces on the flexible substrate layer that overlap the bend axis, wherein each conductive trace has a chain of linked metal trace segments, wherein each metal trace segment includes a first trace portion and a second trace portion that extends away from the first trace portion, wherein the first and second trace portions meet at opposing ends of the metal trace segment to form an opening that is enclosed by the first and second trace portions, and wherein each metal trace segment further includes a third trace portion that extends across the opening from the first trace portion to the second trace portion; and
    a dielectric coating over the conductive traces.

16. The flexible structure defined in claim 15 wherein the dielectric coating comprises a moisture barrier, wherein each conductive trace is formed from overlapping meandering lines, and wherein the overlapping meandering lines are shorted together using metal vias.

* * * * *